United States Patent [19]

Jin

[11] Patent Number: 4,720,692

[45] Date of Patent: Jan. 19, 1988

[54] LONG, NARROW, UNIFORM MAGNETIC FIELD APPARATUS AND METHOD

[75] Inventor: Korda K. Jin, Brea, Calif.

[73] Assignee: The United States of America as represented by the Secretary of the Air Force, Washington, D.C.

[21] Appl. No.: 895,623

[22] Filed: Aug. 11, 1986

Related U.S. Application Data

[63] Continuation-in-part of Ser. No. 664,193, Oct. 24, 1984, Pat. No. 4,605,911.

[51] Int. Cl.$^4$ .............................................. H03H 9/38
[52] U.S. Cl. .................................... 333/144; 333/158; 335/306
[58] Field of Search ............... 335/210, 302, 303, 304, 335/306; 315/5.35; 333/144, 158

[56] References Cited

U.S. PATENT DOCUMENTS

| | | | |
|---|---|---|---|
| 2,936,408 | 5/1960 | Bennetot | 335/306 |
| 3,205,415 | 9/1965 | Seki et al. | 335/210 |
| 3,227,931 | 1/1966 | Adler | 335/304 |
| 3,237,059 | 2/1966 | Meyerer | 335/306 X |
| 3,768,054 | 10/1973 | Neugebauer | 335/306 X |

Primary Examiner—George Harris
Attorney, Agent, or Firm—Gerald B. Hollins; Donald J. Singer

[57] ABSTRACT

A laminar magnetic flux generating apparatus for use with a signal delay line or other apparatus requiring a long, narrow, uniform field. Magnetic flux orthogonal to the primary flux is generated by an array of spaced apart magnets located along the length of the long, narrow, uniform field; combined orthogonal and primary fluxes provide the desired long, narrow, uniform field flux within a magnetically conductive enclosure. Vector summation and fluid analogies for the achieved flux are disclosed.

10 Claims, 1 Drawing Figure

SIDE MAGNETS PRODUCE EDDY FLUX TO
172→RESTRAIN SPREAD OF THE MAIN FLUX.
ALL 4 SIDES HAVE SIDE MAGNETS.

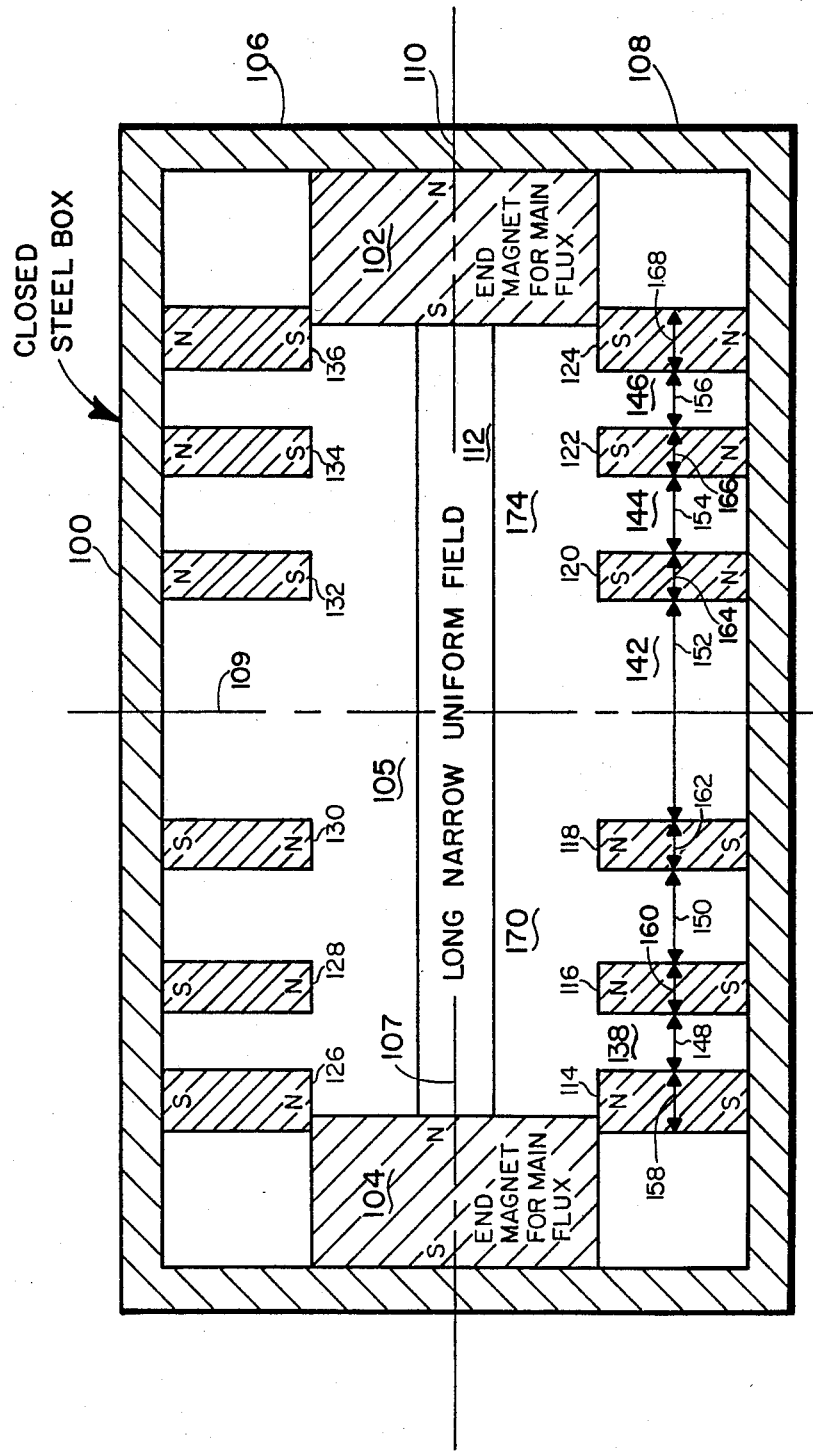

LONG, NARROW, UNIFORM MAGNETIC FIELD APPARATUS AND METHOD

RIGHTS OF THE GOVERNMENT

The invention described herein may be manufactured and used by or for the Government of the United States for all governmental purposes without the payment of any royalty.

CROSS REFERENCE TO RELATED APPLICATION

This application is a continuation in part of Ser. No. 06/664,193, now U.S. Pat. No. 4,605,911, filed 10/24/84, issued 12 Aug. 1986. The disclosure of said U.S. Pat. No. 4,605,911, hereinafter called the parent application, is essential material herein and is hereby incorporated by reference herein.

BACKGROUND OF THE INVENTION

This invention relates to the field of magnetic apparatus, especially as such apparatus is employed to generate relatively long uniform magnetic fields for devices such as an electrical signal delay line.

In the parent application, a large number of closely-spaced magnetomotive force generating elements 214, 216, 218, 220, 224 and 227 (i.e., the elements 214–227) in FIG. 2 of the parent application, are dispersed orthogonally along a magnetic path between two primary sources of magnetomotive force 205 and 206; the primary sources are located at opposite ends of a cavity 202. In this arrangement, the magnetic field developed by the orthogonal magnetomotive force generating elements 214–227 along the primary magnetic flux path is graduated in strength as required to achieve laminar magnetic flux within the cavity 202 by changing the relative magnetic strength of individual orthogonal magnetomotive force generating elements. This graduation in magnetic strength is indicated by the length of the arrows 256, 258, 259, 266, and 268 in FIG. 2 with the stronger dispersed field elements being located in the regions of greatest curvature of the primary magnetic flux lines adjacent the primary sources 205 and 206.

The required variations in the magnetic field produced by the dispersed orthogonal magnetic elements 214–227 in the parent application are achieved with some difficulty, especially in an experimental or small quantity environment. The achievement of magnets of graduated magnetization for use in the dispersed orthogonal magnetomotive flux generating locations of FIG. 2 in the parent application requires precision manufacturing techniques or other arrangements which are difficult to accomplish in laboratory and small quantity environments. The present invention provides a convenient, readily achieved answer for this difficulty and allows the use of simple, low-cost uniform magnetomotive force sources—in comparison with those used in the above-identified parent application apparatus.

The following patents are believed to have some relevance to the present application: U.S. Pat. Nos. 3,480,888; 3,530,409; 3,593,215; 3,895,324; 3,946,340; 4,093,929; 4,152,676; 4,152,677; 3,383,632; 4,165,498; 3,309,628; 3,290,649; 3,707,689; 3,244,993; 2,814,793; 3,225,312; 3,444,484; 4,114,532; 2,983,840; 3,199,513; 2,722,617; 3,257,141; and 3,206,655. All except the latter six of these prior patents were considered during prosecution of the parent application.

SUMMARY OF THE INVENTION

In the present invention a long, narrow uniform magnetic field is achieved through use of spaced apart orthogonally oriented sources of magnetomotive force generating magnetic flux directed orthogonal of the magnetic flux from primary sources of magnetic flux, the orthogonal magnetomotive force sources being dispersed along the flux path of the primary sources.

An object of the present invention is to provide apparatus for generating a long, narrow, uniform magnetic field.

Another object of the invention is to achieve a long, narrow, uniform magnetic field which is usable with electrical signal delay line apparatus especially the magnetostatic backward volume delay line elements described in the above-identified related application.

An object of the present invention is to generate a long, narrow, uniform field using dispersed orthogonal field generating permanent magnets of uniform magnetization and physical length.

Another object of the invention is to provide a long, narrow, uniform field using permanent magnets of uniform magnetization and physical length spaced in response to the curvature tendency of a primary lengthwise magnetic field.

Another object of the invention is to provide an apparatus for generating long, narrow, uniform mangetic field wherein the main or primary flux is restrained from spreading by side magnets located on all sides of the primary flux path.

Another object of the invention is to provide for long, narrow, uniform magnetic field generation wherein the side magnets generating orthogonal magnetic field flux are in the form of a parabola.

BRIEF DESCRIPTION OF THE DRAWING

The drawing shows a cross-sectional view of a long, narrow, uniform field generating apparatus according to the invention including a cavity wherein the long, narrow, uniform field occurs and wherein a delay line element may reside.

DETAILED DESCRIPTION

In the magnetostatic surface backward volume wave delay line apparatus described in the incorporated by reference patent application the closely spaced dispersed magnetomotive force generating elements 214, 216, 218, 220, 222, 224, 226 and 227 in FIG. 2 are somewhat difficult to achieve, especially in small quantity lots—since varying degrees of magnetization in these elements is the first blush choice for achieving needed variations of orthogonal field strength. The graduated in strength magnetic field developed by the dispersed elements 214–227 in FIG. 2 of the parent application is described commencing at column 8, line 7 of the specification for the parent application.

The figure of drawing in the present invention shows an improved arrangement for generating the graduated strength magnetic field required in correcting the curvature tendency of the natural magnetic field lines such as the line 252 in FIG. 2 of the parent application. In the drawing herein, a magnetically conductive enclosure 100 which may be the form of a steel shell, is shown to enclose a pair of primary magnetomotive force sources 102 and 104 which are located at opposite ends of an enclosed region 105. The primary sources 102 and 104 generate primary magnetic flux tending to fall along curved natural magnetic field lines of the type shown at 252 in FIG. 2 of the parent application. In the drawing of the present application, the orthogonal maganetomotive force needed for correcting the curvature of the magnetic field line 252, the correction shown by the vectors 270, 271, 272 and 277 in FIG. 2 of the parent application, is generated by a plurality of magnetomotive force generating elements such as the permanent magnets 114, 116, 118, 120, 122, 124, 126, 128, 130, 132, 134 and 136 (i.e., the magnets 114–136). The magnets 114–136 are dispersed axially along the flux path existing between the sources 102 and 104 and are segregated by physical separation distances 138, 140, 142, 144 and 146 (i.e., separations 138–146) which are of lengths indicated by the arrows 148, 150, 152, 154 and 156 (i.e., arrows 148–156). In the invention the separations 138–146 are made to finite and non-zero in size and also to be of graduated length as indicated by the varying lengths of the arrows 148–156.

By way of these varying separations 138–146 between the magnets 114–136, the amount of flux needed to correct the curvature of the natural magnetic field lines such as the line 252 in FIG. 2 of the parent application can be generated with magnets 114–136 of uniform magnetization and uniform physical size. These uniformities are of a great convenience in laboratory use of the invention and in small quantity uses where permanent magnets of graduated magnetization are of limited availability.

In addition to the graduated separations 138–146, the drawing illustrated embodiment of the invention also indicates that the thickness of the magnets 114–136, that is, the thickness represented by the thickness arrows 158, 160, 162, 164, 166 and 168 (i.e., the arrows 158–168) may also be varied in order to achieve optimum correction of the natural magnetic field lines such as the line 252 in the parent application.

Generation of the desired long, narrow, uniform field along axis 107 in the present drawing from the curving natural magnetic field line 252 in FIG. 2 of the present application may be considered to occur according to the vector summation arrangement shown at 270, 271, 272 and 277 in FIG. 2 of the parent application. Alternately this generation may be considered by analogy to result from restriction or restraint of the primary flux from the sources 102 and 104 in the drawing herein from spreading by disposition of magnets 114–136 along the flux path. According to this restriction or restraint of the primary flux analogy, the magnets 114–136 create local eddy flux, as described in the legend 172 of the drawing, which effectively blocks the main or primary magnetic flux from spreading outward. According to this eddy flux concept, the space between the magnets 114–136 may be presumed filled by flux from the magnets 114–136 to the exclusion of flux originating in the primary sources 102 and 104. By analogy then, the present invention may be likened to the prevention of escape of the flux originating in the primary sources 102 and 104 from the desired long, narrow, uniform field attending the cavity 112 by way of flux eddies generated by the magnets 114–136 as opposed to the arrangement described in the parent application which might be likened to the building of a dam near the bank of a stream in order to prevent leakage flux escape.

Additional details of the embodiment shown in the drawing include the half-shell members 106 and 108 which comprise the magnetically conductive enclosure 100 and the junction 110 between the half-shell members 106 and 108—the junction 110 falls on and is coincident with the axis 107 in the cross-sectional view of the drawing. Also shown in the drawing is the vertical center line 109 and the extended cavity 112 in which the desired long, narrow, uniform magnetic field resides and in which a delay line element such as the YIG element 200 in the parent application may also reside.

Additionally shown in the drawing of the present invention are the relative polarities desired for the primary magnetomotive force source magnets 102 and 104 and the orthogonal field generating magnets 114–136, these polarities are indicated typically at 170 in the drawing. The space 174 in the drawing may of course contain an electromagnetic coil such as the coil 274 in FIG. 2 of the parent application or contain other apparatus needed in connection with the delay line or other utilization apparatus for the disclosed invention.

The magnets 114–136 in the drawing are presumed to extend into the sheet—toward a lower wall of the conductive enclosure 100 lying below the plane of the drawing. In a similar manner, additional magnets of the type shown at 114–136 are presumed disposed along this lower wall and on a similar upper wall of the conductive enclosure 100 located above the plane of the drawing; in other words, magnets of the type represented at 114–136 are presumed to reside on all four lateral sides of the cavity 112. Alternately, of course, the magnets 114–136 can be made circular or otherwise curving in nature to surround the cavity 112—especially in the presence of a curved magnetically conductive enclosure 100. This presence of orthogonal magnets on all four sides of the extended cavity 112 is indicated in the legends 172 of the drawing.

The varied length of the separations 138–146 in the drawing, that is, the variation in the length of the arrows 148–156 is in response to the slope variations of the natural magnetic field lines such as the line 252 in FIG. 2 of the parent application. Magnetic flux lines of this type tend to have greatest slope or greatest curvature near the sources 102 and 104 and thereby require the greatest degree of correction and closest spacing of the magnets 114–136 in the regions adjacent the sources 102 anad 104. In the central portion 253 of the natural magnetic field line 252 in FIG. 2 of the parent application, little curvature change exists and therefore little orthogonal maganetic flux is required; hence the large separation 142 as indicated by the long arrow 152 in the drawing of the present application. The disclosed apparatus is capable of providing magnetic flux densities which are uniform to within the range of a four percent variation with the cavity 112.

While the apparatus and method herein described constitute a preferred embodiment of the invention, it is to be understood that the invention is not limited to this precise form of apparatus or method, and that changes may be made therein without departing from the scope of the invention, which is defined in the appended claims.

I claim:

1. Magnetostatic delay line apparatus comprising:
 first and second sources of magnetomotive force located at two displaced points along an axis and polarized to establish primary magnetic field flux lines commencing at said first source, extending along said axis in an outward curving line pattern having flux line components directed both parallel and perpendicular to said axis and ending at said second source;

magnetomotive force source means located along said axis for diverting said magnetic field flux lines from said curving line pattern to a pattern of flux lines extending parallel to said axis between said first and second sources, said magnetomotive force source means including a plurality of discrete magnetomotive force sources dispersed along said axis and radially thereabout for generating magnetic field lines that are orthogonally oriented with respect to said axis, said discrete magnetomotive force sources being of predetermined finite, non-zero spacial separations measured along said axis, with said predetermined finite non-zero spatial separations being determined in response to the local degree of said outward curvature and the required diversion of said primary magnetic field flux lines to achieve said flux lines extending parallel to said axis;

a cavity receptacle concentric with said axis and communicating therealong between said first and second sources of magnetomotive force; and a magnetostatic delay line element lengthwise located within said cavity receptacle surrounded by said parallel extending flux lines.

2. The apparatus of claim 1 further including magnetically conductive enclosure means disposed surrounding said cavity receptacle and said magnetomotive force sources.

3. The apparatus of claim 1 wherein said magnetomotive force source means magnetomotive force sources are also of predetermined different widths measured along said axis.

4. The apparatus of claim 1 wherein said magnetomotive force source means magnetomotive force sources are of a common length dimension disposed radially of said axis.

5. The apparatus of claim 1 wherein said magnetomotive force source means magnetomotive force sources are of substantially the same magnetization strength.

6. The apparatus of claim 1 wherein said magnetomotive force source means magnetomotive force sources comprise permanent magnets of rectangular cross-sectional shape.

7. The apparatus of claim 1 wherein said magnetomotive force sources comprise permanent magnets of rectangular cross-sectional shape and common width dimension measured along said axis.

8. The apparatus of claim 7 wherein said permanent magnets of rectangular cross-sectional shape are physically separated by spatial separations of said common width dimension length and greater lendths.

9. Laminar magntic flux generating apparatus comprising:

first and second sources of magnetomotive force located at two displaced points along an axis and polarized to establish primary magnetic field flux lines commencing at said first source; tending to extend along said axis in an outward curving line pattern having flux line components directed both parallel and perpendicular of said axis and ending at said second source;

magnetomotive force eddy source means located along said axis for restraining said outward curving line pattern to flux lines extending parallel to said axis between said first and second sources;

said magnetomotive force source means including a plurality of discrete magnetomotive force sources dispersed along said axis and radially about said axis for generating eddy flux magnetic field lines that are outwardly curvature blocking with respect to said primary magnetic field flux lines, said discrete magnetomotive force sources being of predetermined finite, non-zero spatial separations measured along said axis, with said predetermined finite non-zero spatial separations being determined in response to the local degree of said outward curvature; and a cavity receptacle concentric with said axis and communicating therealong between said first and second sources of magnetomotive force.

10. The method of generating laminar magnetic flux within a cavity which also contains a central axis comprising the step of:

generating magnetic field flux lines commencing at a first source thereof and tending to extend along said axis in an outward curving line pattern having flux line components directed both parallel and perpendicular of said axis and ending at a second source thereof; and diverting said magnetic field flux lines from said curving line pattern to a pattern of lines extending parallel to said axis between said first and second sources, said diverting including creating interacting magnetic field lines that are orthogonally oriented with respect to said axis at axially segregated spatially separated points along said axis, said spatial separations being of predetermined finite length in response to the localized degree of said outward curvature and the parallel line required diversion of said first and second source magnetic field flux lines.

* * * * *

UNITED STATES PATENT AND TRADEMARK OFFICE
CERTIFICATE OF CORRECTION

PATENT NO. : 4,720,692

DATED : January 19, 1988

INVENTOR(S) : Korda K. Jin

It is certified that error appears in the above-identified patent and that said Letters Patent is hereby corrected as shown below:

Col 2, line 28, replace "mangetic" with --magnetic--.

Col 2, line 29, replace "field" with --fields--.

Col 3, lines 3 and 4, replace "maganetomotive" with --magnetomotive--.

Col 4, line 46, replace "maganetic" with --magnetic--.

Col 5, Claim 8, line 4, replace "lendths" with --lengths--.

Col 6, Claim 9, line 1, replace "magntic" with --magnetic--.

Signed and Sealed this

Twentieth Day of December, 1988

Attest:

DONALD J. QUIGG

Attesting Officer

Commissioner of Patents and Trademarks